(12) United States Patent
Morooka et al.

(10) Patent No.: US 6,323,645 B1
(45) Date of Patent: Nov. 27, 2001

(54) SUPERCONDUCTING QUANTUM INTERFERENCE DEVICE

(75) Inventors: Toshimitsu Morooka; Akikazu Odawara, both of Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/389,254

(22) Filed: Sep. 3, 1999

(30) Foreign Application Priority Data

Sep. 7, 1998 (JP) .................................................. 10-252973

(51) Int. Cl.[7] .................................................. G01R 33/02
(52) U.S. Cl. .............................. 324/248; 505/161; 257/31
(58) Field of Search ...................... 257/31–36, 661–663; 505/161, 162, 190, 191; 324/248, 249

(56) References Cited

U.S. PATENT DOCUMENTS

| | | | |
|---|---|---|---|
| 4,489,274 | * 12/1984 | Berlincourt | 324/248 |
| 5,166,614 | * 11/1992 | Yokosawa et al. | 324/248 |
| 5,173,660 | * 12/1992 | Marsden | 324/248 |
| 5,293,119 | * 3/1994 | Podney | 324/242 |
| 5,548,130 | * 8/1996 | Shimizu et al. | 257/31 |

OTHER PUBLICATIONS

IBM Technical Disclosure Bulletin, Mar. 1985 vol. 27, Issue 10A, pp. 5847–5848.*

* cited by examiner

*Primary Examiner*—Nathan Flynn
*Assistant Examiner*—Scott R. Wilson
(74) *Attorney, Agent, or Firm*—Adams & Wilks (57) ABSTRACT

A superconducting quantum interference device is provided which can accurately measure only a magnetic field detected by a detection coil where the superconducting quantum interference device is used for a fluxmeter. A superconductor for enclosing a loop to be formed by a washer coil is formed at an upper portion or lower portion of the washer coil. Otherwise, a ground plane layer is formed with an interlayer insulation film sandwiched, in a position, except for a detection coil, particularly, of an upper layer or lower layer, of a washer coil being magnetically coupled to a feedback-modulation coil to which a signal is sent from an external control system. As a result, it is possible to prevent an external magnetic field from being coupled to other regions than the detection coil and hence accurately measure a magnetic field linked to the detection coil. In particular, the invention is effective for a reduced detection area of a detection coil thus suited for measurement on high spatial resolution.

26 Claims, 7 Drawing Sheets

SUPERCONDUCTING QUANTUM INTERFERENCE DEVICE

BACKGROUND OF THE INVENTION

This invention relates to superconducting quantum interference devices used for measurement of a fine magnetic field, electric current, voltage, electromagnetic wave and so on and, more particularly, to a superconducting quantum interference device enabling high sensitivity measurement and spatial resolution but low in noise.

Figure 7:
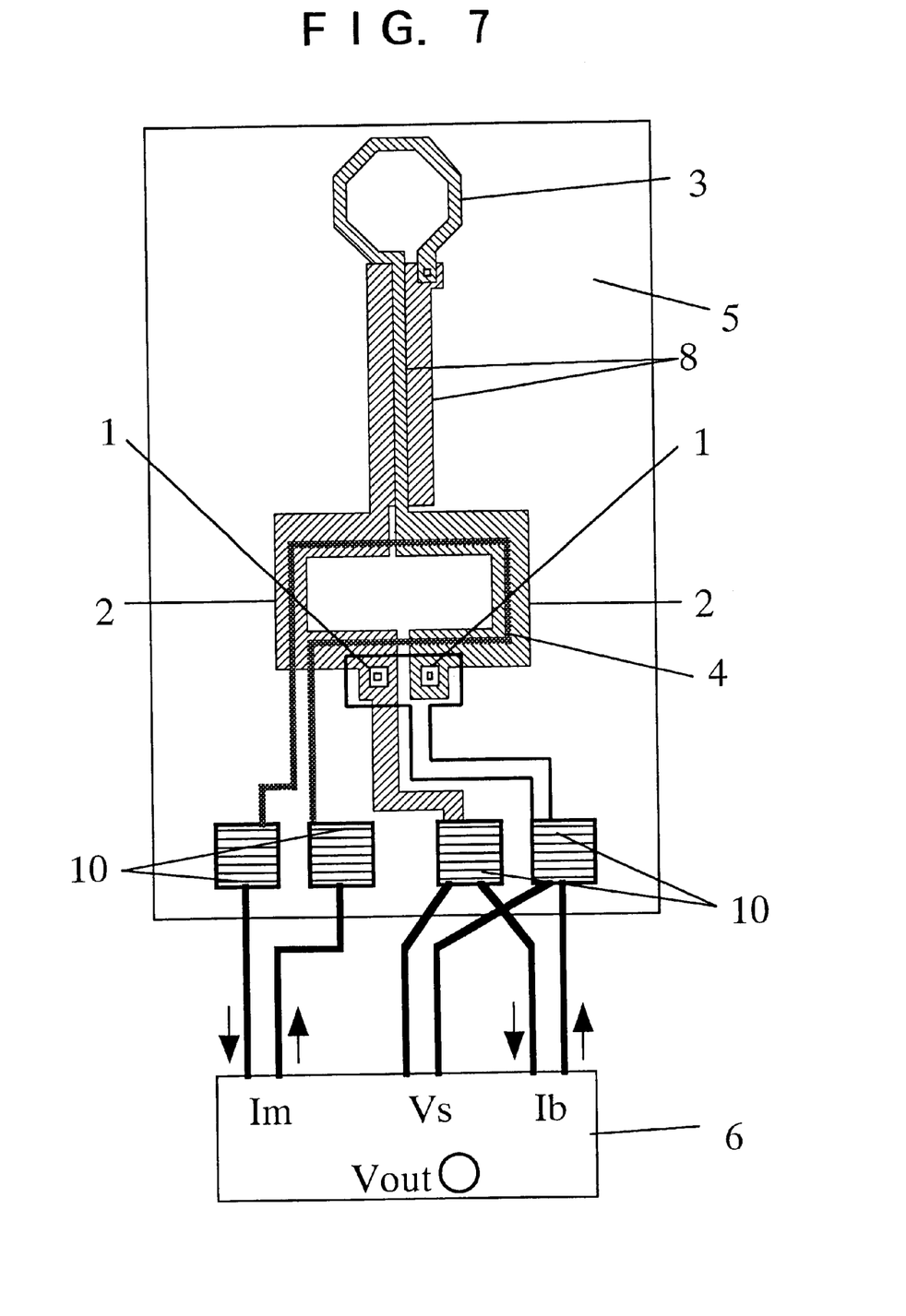
FIG. 7 is a structural view showing a superconducting quantum interference device according to a prior art.

There is shown in FIG. 7 a structural view of a superconducting quantum interference device (hereinafter abbreviated as SQUID) according to the prior art. On a substrate 5 are integrated Josephson junctions 1, washer coils 2, a detection coil 3, and a feedback-modulation coil 4. The SQUID shown in FIG. 7 is a DC-SQUID including two Josephson junctions in a superconducting loop. The feedback-modulation coil 4 is magnetically coupled to the washer coils 2. A superconducting loop is constituted by the detection coil 3 for external magnetic field detection, the washer coils 2, and a pair of the Josephson junctions 1 is connected at the respective ends of the washer coils.

The SQUID is connected to an external control system 6 and supplied with a bias current Ib. The external control system 6 feeds back to the superconducting loop a control signal Im corresponding to a SQUID output Vs. The control signal Im is delivered as a magnetic signal to the superconducting loop through the feedback-modulation coil 4 magnetically coupled to the washer coil 2. An output voltage signal Vout corresponding to an external magnetic field, which has been detected by the detection coil 3 is obtained on the external control system.

In order to obtain high spatial resolution, the detection coil has to be made small in size. Due to this, as shown in FIG. 7 a fine detection coil 3 is integrated, together with the Josephson junctions 1 and washer coils 2, on the substrate.

Conventionally, the SQUID used for measurement on high spatial resolution has integrated Josephson junctions and washer coils and the like, together with a fine detection coil, on a common substrate. A signal generated by a signal source is detected by the detection coil. Meanwhile, a magnetic field due to the signal source links similarly to the washer coil. In such a case, measurement is made on the basic of a magnetic field linked to both the detection coil and the washer coil. As a consequence, it is difficult to measure with accuracy a magnetic field linked only to the detection coil that is to be measured.

In the case where using a detection coil having a small detection area, there is a considerable affection of a magnetic field linked to portions other than the detection coil, and particularly the washer coil.

SUMMARY OF THE INVENTION

In order to solve the above problem, the present invention utilizes a superconductor for enclosing a loop formed by a washer coil that is formed at an upper portion or lower portion of the washer coil, or a washer coil formed on a ground plane of a superconducting thin film, thereby preventing a magnetic field caused by a signal source from being linked to portions other than a detection coil.

DETAILED DESCRIPTION OF THE PREFERRED EMBODIMENTS

Now embodiments of the present invention will be described with reference to the drawings.

Figure 1:
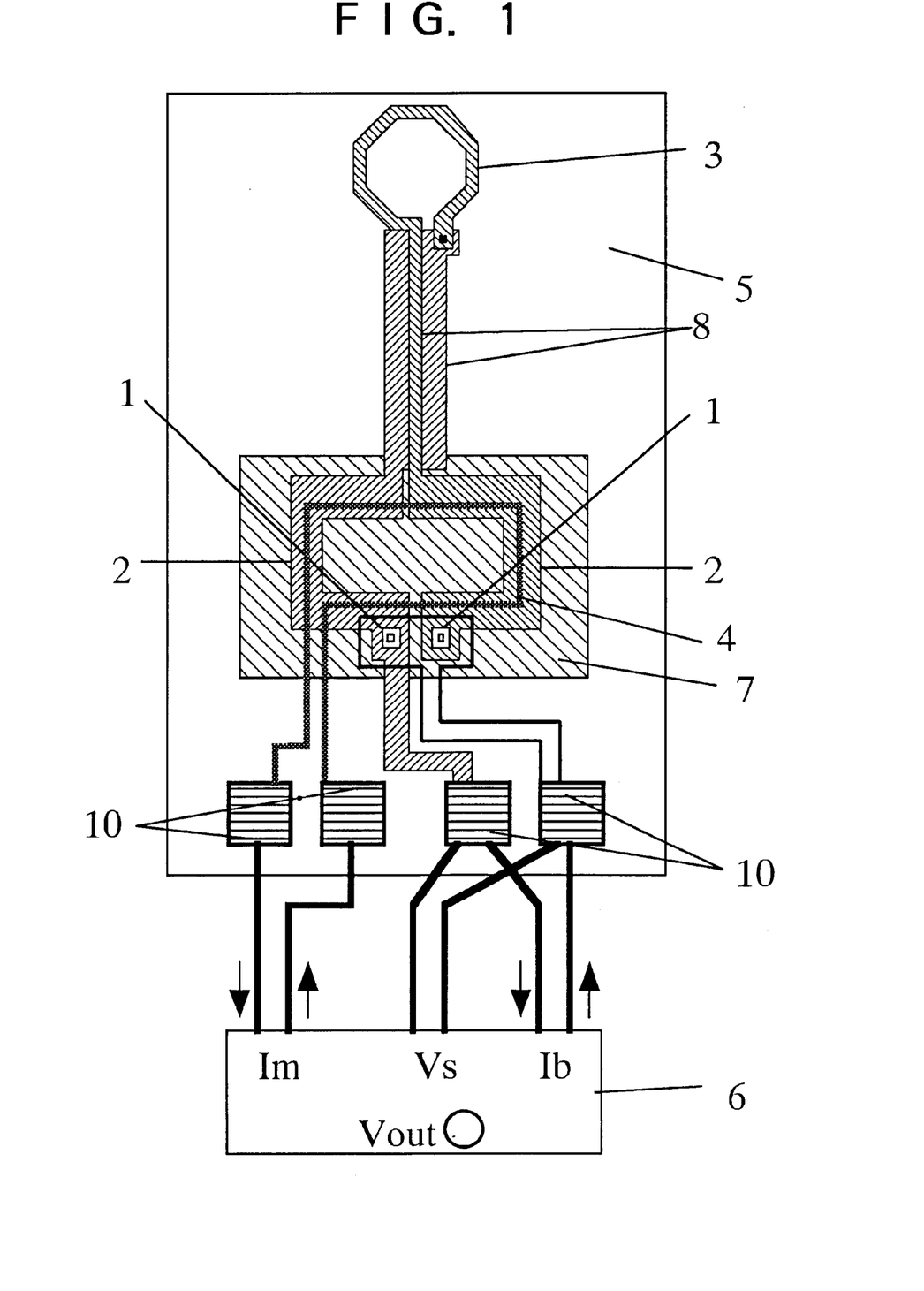
FIG. 1 is a structural view showing a superconducting quantum interference device according to Embodiment 1.
Figure 2:
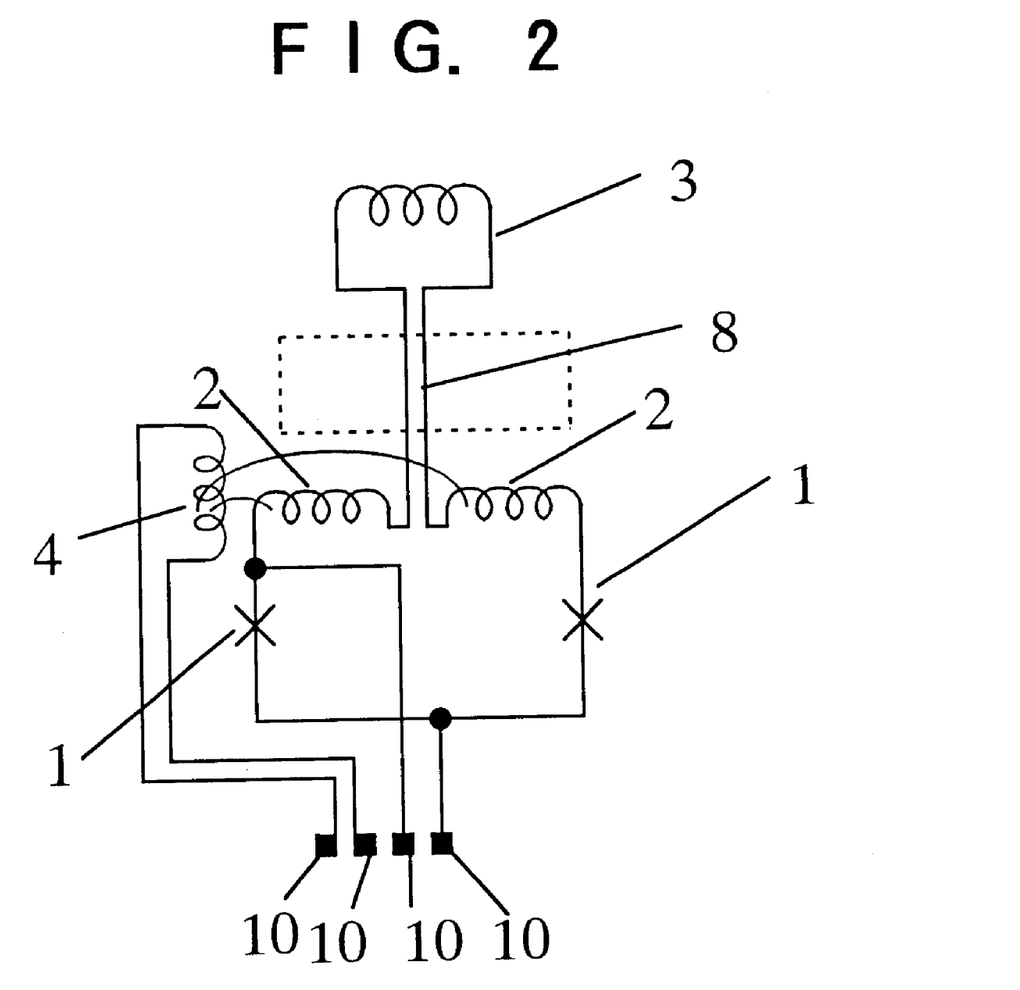
FIG. 2 is an equivalent circuit diagram showing the superconducting quantum interference device according to Embodiment 1.

FIG. 1 shows a structural view of a superconducting quantum interference device (hereinafter abbreviated as SQUID) showing Embodiment 1 of the invention, while FIG. 2 shows an equivalent circuit diagram of the same. The SQUID shown in FIG. 1 and FIG. 2 is a DC-SQUID including two Josephson junctions in a superconducting loop. On a substrate 5 are integrated Josephson junctions 1, washer coils 2, a detection coil 3, and a feedback-modulation coil 4. The feedback-modulation coil 4 is magnetically coupled to the washer coils 2. A superconducting loop is constituted by the detection coil 3 for magnetic field detection, the washer coils 2, and a pair of the Josephson junctions 1 connected at respective ends of the washer coils. A super conductor to enclose the loop formed by the washer coils 2 is formed as an upper layer or lower layer of the washer coil 2. Alternatively, the washer coils 2 are formed on a ground plane 7. A strip line structure is provided for a detection-coil-and-washer-coil connection line 8, serving as a connection part between the detection coil and washer coils. In FIG. 2, no ground plane layer is depicted.

The SQUID is connected to an external control system 6, for supplying a bias current Ib. The external control system 6 feeds back to the superconducting loop a control signal Im corresponding to a SQUID output Vs. The control signal Im is delivered as a magnetic signal to the superconducting loop through the feedback-modulation coil 4 magnetically coupled to the washer coils 2. Thus, an output voltage signal Vout corresponding to an external magnetic field, which has been detected by the detection coil 3, is obtained by the external control system 6.

The SQUID of the present embodiment has the superconductor formed at the upper portion or lower portion of the washer coil 2, to enclose the loop formed by the washer coils 2. Alternatively, the washer coils 2 are formed on the ground plane. Accordingly, the external magnetic field cannot extend through the ground plane. As a consequence, it is possible to prevent linking to the washer coils 2. Meanwhile, the strip line structure for the detection-coil-and-washer-coil connection line 8 reduces magnetic field linking at that position. Due to this, there is no magnetic field coupling at regions other than the detection coil 3. It is therefore possible to conduct measurement only on the magnetic field being linked to the detection coil 3, thus enabling measurement with higher accuracy.

As a means for high spatial resolution, the detection coil 3 is made small in size. It is particularly effective in use a detection coil with a small detection area.

Figure 3:
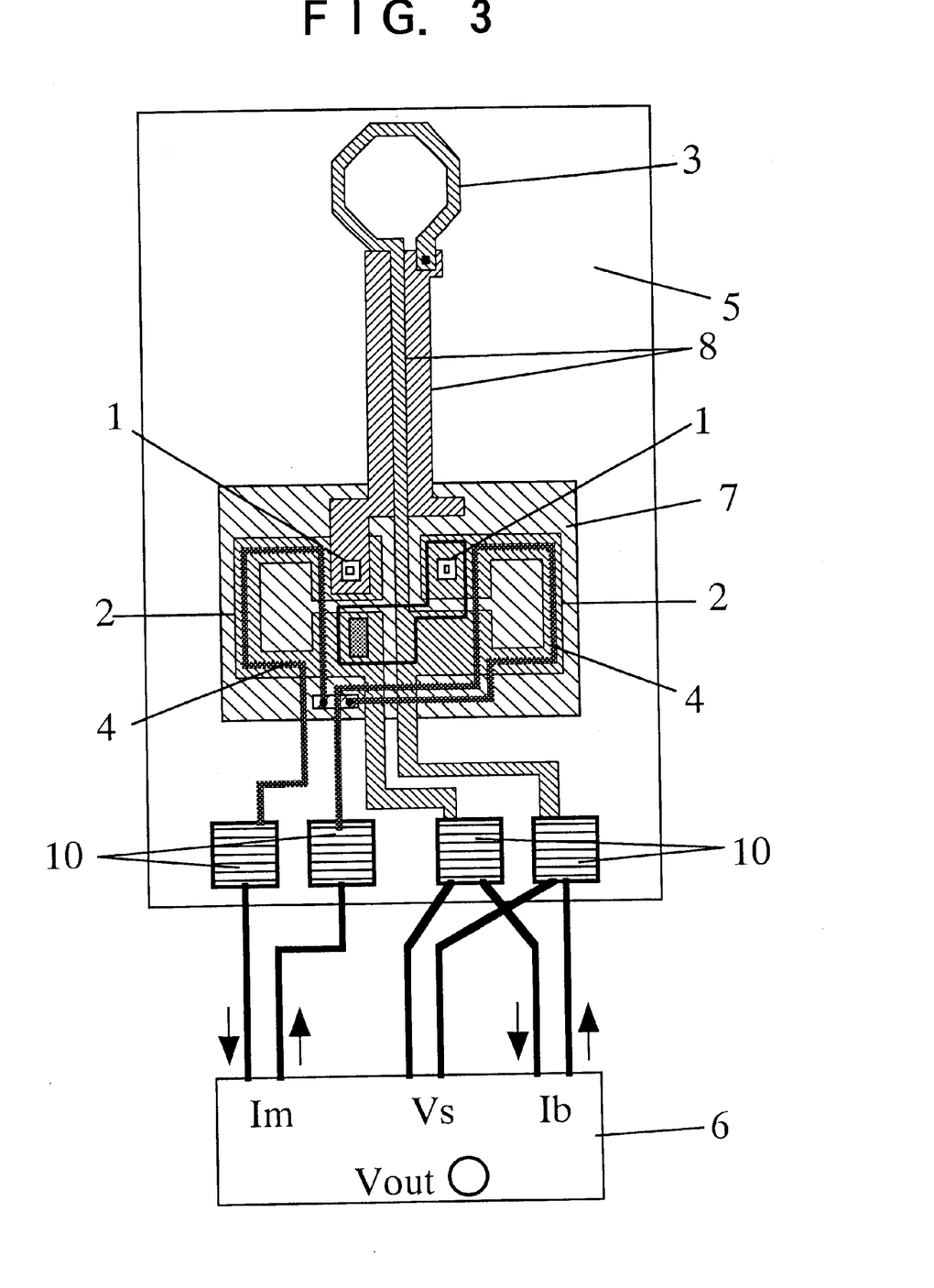
FIG. 3 is a structural view showing a superconducting quantum interference device according to Embodiment 2.
Figure 4:
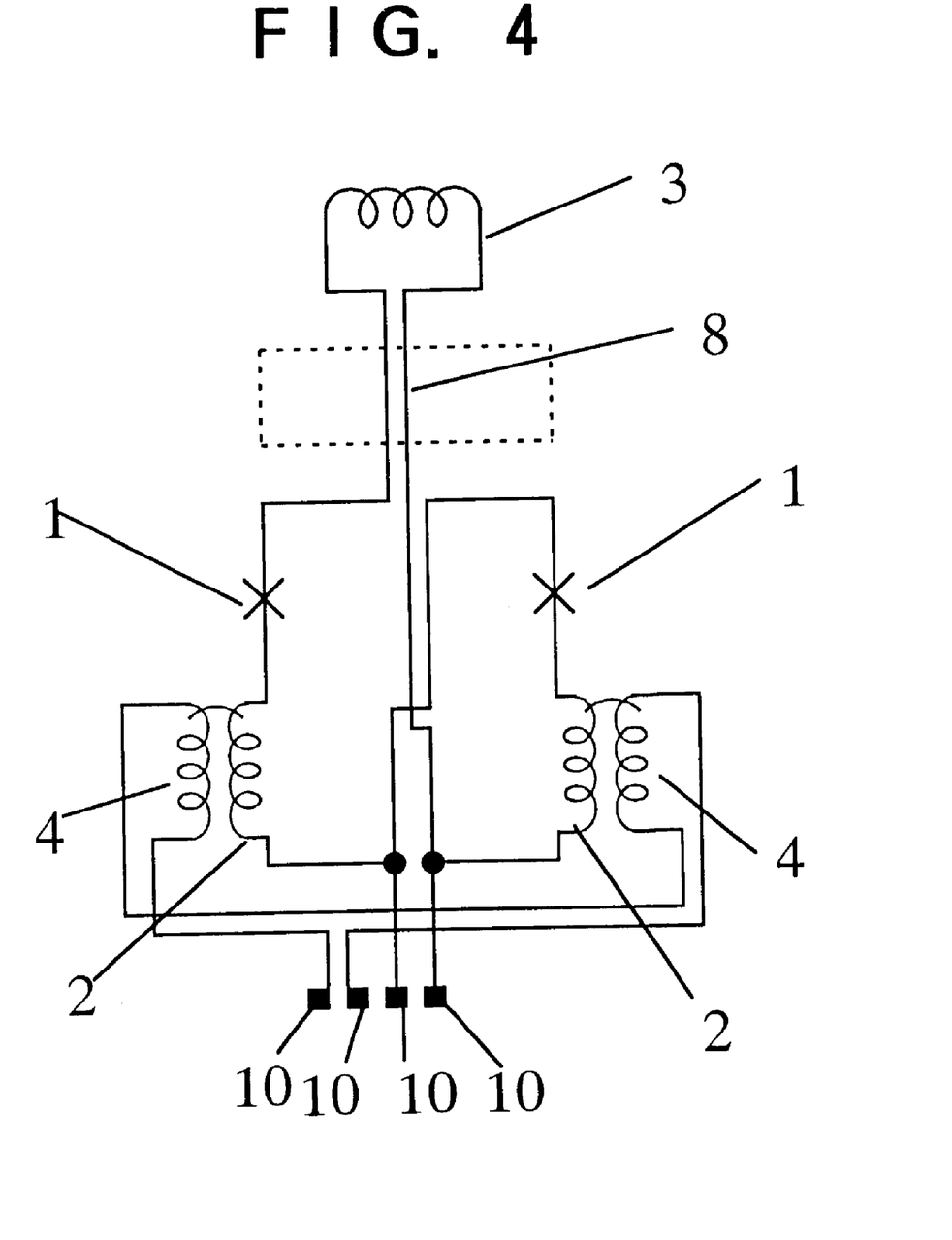
FIG. 4 is an equivalent circuit diagram showing the superconducting quantum interference device according to Embodiment 2.

FIG. 3 shows a structural view of a superconducting quantum interference device showing Embodiment 2 of the invention, while FIG. 4 shows an equivalent circuit diagram of the same.

The SQUID of this embodiment is a DC-SQUID of a double washer structure having two washer coils 2 connected oppositely in series to each other. A superconductor is formed at an upper layer or lower layer of the washer coil 2 to enclose the loop formed by the washer coils 2. Alternatively, these two washer coils 2 are formed on a ground plane 7. Respective feedback-modulation coils 4 are magnetically coupled to the washers 2. A superconducting loop is constituted by the detection coil 3, the two washer coils 2, and two Josephson junctions 1. In FIG. 4, no ground plane layer is depicted.

In this embodiment, besides the washer coils 2 formed on the ground plane and a strip line structure of a coil-and-washer-coil connection line 8, the double washer structure is provided in which the washer coils 2 themselves are in opposite directions. Due to this, it is possible. to efficiently eliminate a magnetic field linking to the washer coils 2.

Figure 5:
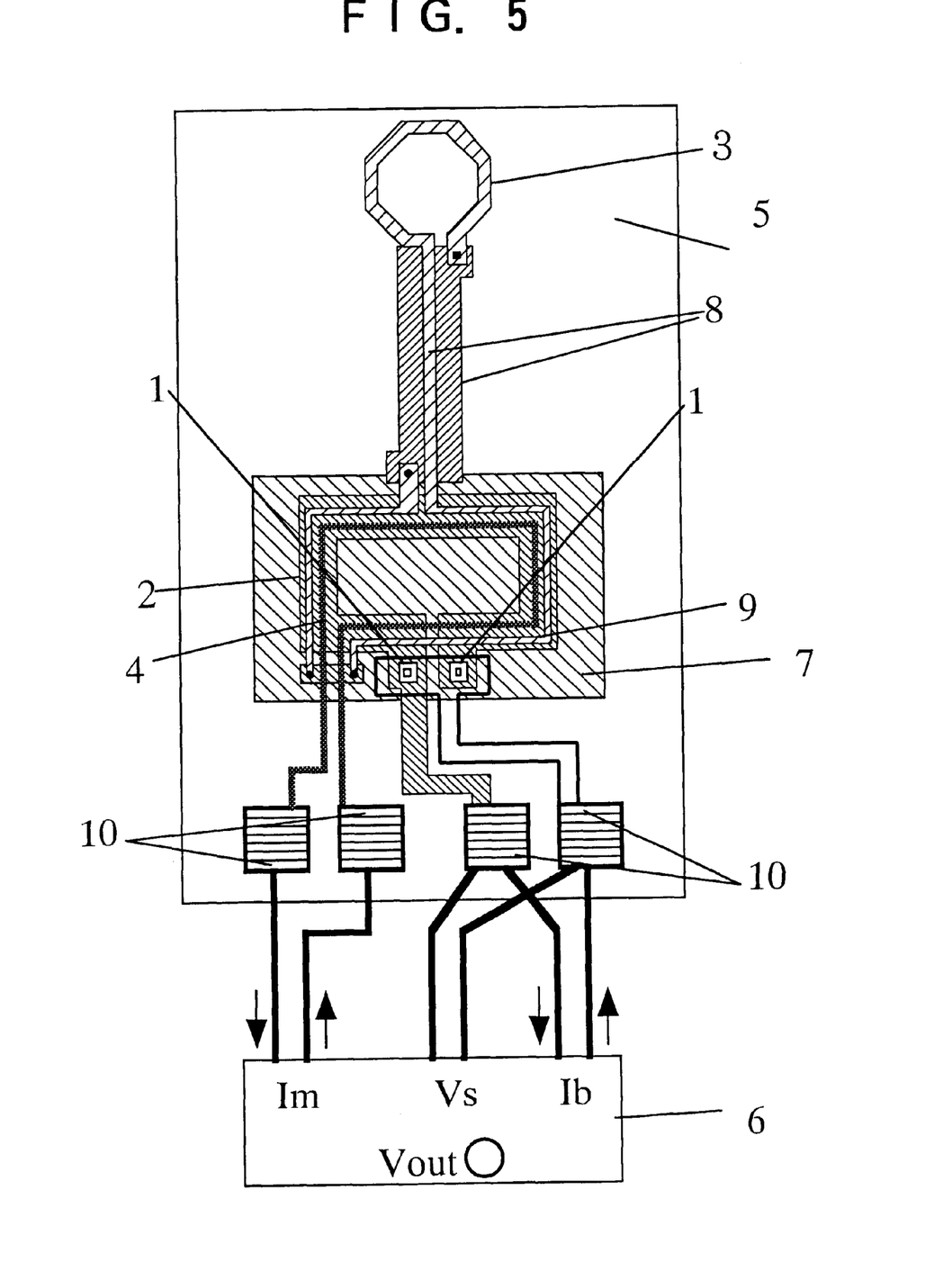
FIG. 5 is a structural view showing a superconducting quantum interference device according to Embodiment 3.
Figure 6:
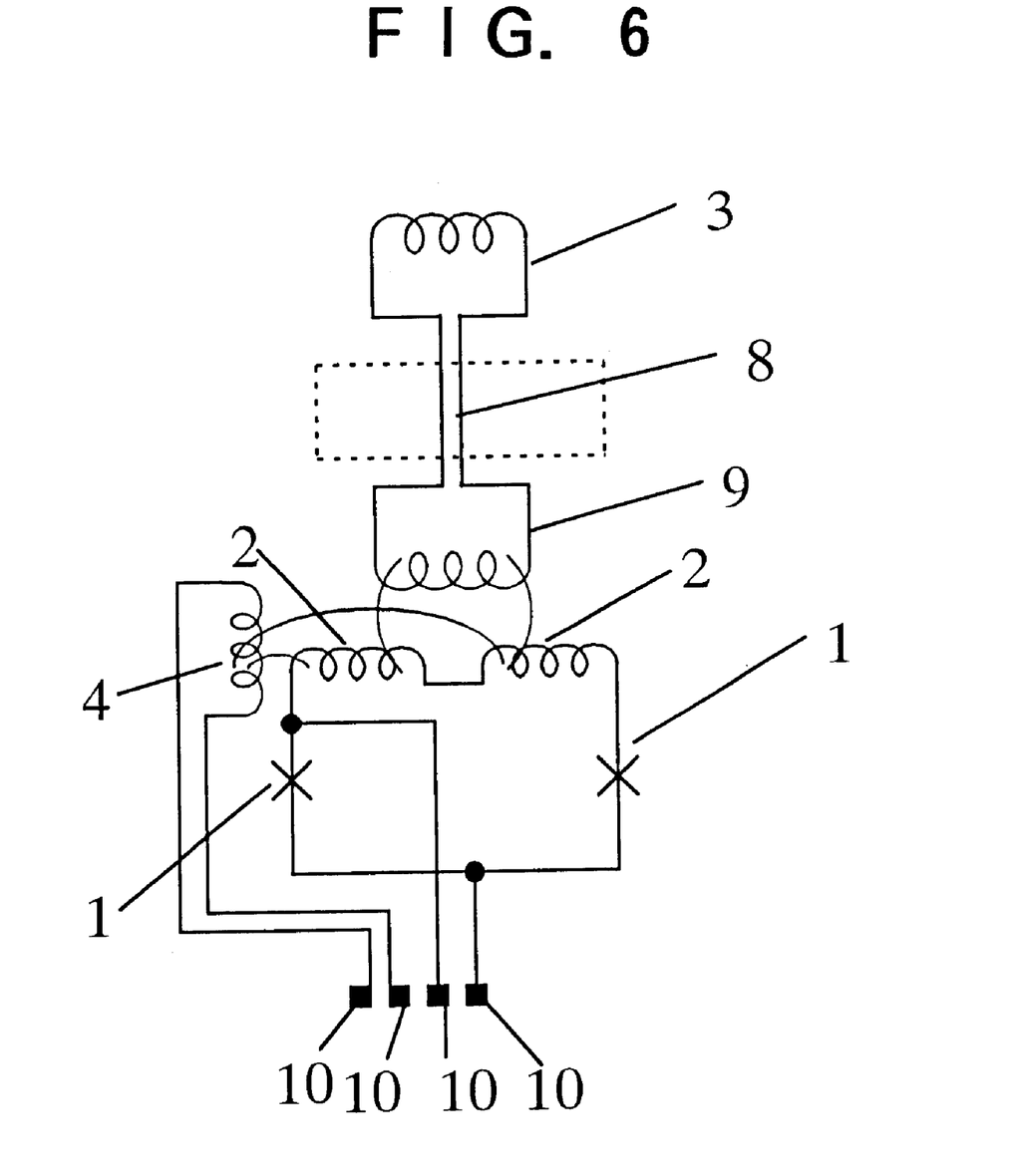
FIG. 6 is an equivalent circuit diagram showing the superconducting quantum interference device according to Embodiment 3.

FIG. 5 shows a structural view of a superconducting quantum interference device showing Embodiment 3 of the invention, while FIG. 6 shows an equivalent circuit diagram of the same. On a substrate 5 are integrated Josephson junctions 1, a washer coil 2, a detection coil 3, a feedback-modulation coil 4, and an input coil 9. A super conductor is formed as an upper layer or lower layer of the washer coil 2 to enclose a loop formed by the washer coils 2. Alternatively, the washer coils 2 are formed on a ground plane 7. A first superconducting loop is formed by the washer coil 2 and a pair of Josephson junctions 1 connected at respective ends of the washer coil 2.

The detection coil 3 for magnetic field detection and the input coil 9 are connected through coil-and-washer-coil connection line 8 which has a strip line structure, forming a second superconducting loop. Meanwhile, the input coil 3 is magnetically coupled to the washer coil 2. The magnetic field detected by the detection coil 3 is delivered to the first superconducting loop through the input coil 9. In FIG. 6, no ground plane layer is depicted.

The SQUID shown in the present embodiment has, similarly, the superconductor formed at the upper portion or lower portion of the washer coil 2, to enclose the loop formed by the washer coil 2. Alternatively, provided are the washer coil 2 formed on the ground plane and the coil-washer-coil connection lines 8 with the strip line structure. Accordingly, it is possible to eliminate magnetic field linking to the washer coil 2. The detection coil 3 and the input coil 9 form a second superconducting loop, which provides a feature to freely select a form for the detection coil. Besides a 1-turn coil, a complicated form of a detection coil can be employed, including, for example, a differential type detection coil.

The present invention is practiced in the embodied forms as explained above, and has the following effects.

By forming a superconductor for enclosing a loop to be formed by a washer coil at an upper layer or lower layer of the washer coil, or otherwise forming on a ground plane a washer coil used for delivering a signal sent from an external control system to a superconducting loop through a feedback-modulation coil, it is possible to prevent an external magnetic field from being linked to the washer coil. Due to this, there is no magnetic coupling in regions other than a detection coil, and measurement is possible only on a magnetic field linked to the detection coil. Thus, measurement is possible with higher accuracy. Although detection coil size reduction is implemented as a means to enhance spatial resolution, the invention is effective for a reduced area of a detection coil thus suited for measurement with high spatial resolution.

Also, by forming a superconductor for enclosing a washer coil in an upper layer or lower layer of the washer coil with an interlayer insulation layer sandwiched, that is, by forming a ground plane layer, it is possible to closely provide the washer coil and the shielding superconductor, enhancing the magnetic field shielding effect.

Also, by using a material having a critical magnetic field greater than a critical magnetic field of the superconducting thin film forming the Josephson junction and washer coil, it is possible to provide a magnetic field shielding effect for the washer coil. At the same time, use in an intense magnetic field becomes possible without losing superconductivity.

Furthermore, by forming the superconductor for enclosing a loop to be formed by the washer coil of a first kind superconductor material, it becomes possible to completely shield a magnetic field at and under a critical magnetic field for the first kind superconductor.

What is claimed is:

1. A superconducting quantum interference device which generates a voltage signal periodically varied by a magnetic flux comprising: a Josephson junction; a washer coil coupled to the Josephson junction to form a superconducting loop; a detection coil coupled to the washer coil for detecting an external magnetic field; a feedback-modulation coil magnetically coupled to the washer coil; an external control system for supplying a signal to the detection coil to detect an external magnetic field, the control signal being supplied to the detection coil through the feedback-modulation coil; and a superconductor for enclosing a loop formed by the washer coil, the superconductor being formed on or under the washer coil.

2. A superconducting quantum interference device according to claim 1; wherein the superconductor for enclosing the washer coil is a ground plane layer formed on one of an upper layer and a lower layer of the washer coil with an interlayer insulation layer sandwiched therebetween.

3. A superconducting quantum interference device according to claim 2; wherein the superconductor for enclosing a loop formed by the washer coil is formed of a material having a critical magnetic field greater than a critical magnetic field of superconducting thin films forming the Josephson junction and the washer coil.

4. A superconducting quantum interference device according to claim 2; wherein a superconductor for enclosing a loop to be formed by the washer coil is formed by a thin film of a superconductor material.

5. A superconducting quantum interference device according to claim 1; wherein the superconductor for enclosing a loop formed by the washer coil is formed of a material having a critical magnetic field greater than a critical magnetic field of superconducting thin films forming the Josephson junction and the washer coil.

6. A superconducting quantum interference device according to claim 1; wherein a superconductor for enclosing a loop formed by the washer coil is formed by a thin film of a superconductor material.

7. A superconducting quantum interference device which generates a voltage signal periodically varied by a magnetic flux comprising: a Josephson junction; a washer coil coupled to the Josephson junction to form a first superconducting loop; a detection coil coupled to the washer coil; a feedback-modulation coil magnetically coupled to the washer coil; an input coil magnetically coupled to the washer coil and forming a second superconducting loop together with the detection coil for delivering an external magnetic field detected by the detection coil to the first superconducting loop; an external control system for supplying a signal to the detection coil to detect an external magnetic field, the control signal being supplied to the first superconducting loop through the feedback-modulation coil; and a ground plane layer formed of a superconductor enclosing a loop formed by the washer coil, the superconductor being formed as an upper layer or a lower layer of the washer coil with an interlayer insulation layer sandwiched therebetween.

8. A superconducting quantum interference device according to claim 7; wherein the superconductor for enclosing a loop formed by the washer coil is formed of a material having a critical magnetic field greater than a critical magnetic field of superconducting thin films forming the Josephson junction and the washer coil.

9. A superconducting quantum interference device according to claim 7; wherein the superconductor for enclosing a loop formed by the washer coil is formed of a material having a critical magnetic field greater than a critical magnetic field of superconducting thin films forming the Josephson junction and the washer coil.

10. A superconducting quantum interference device according to claim 7; wherein the superconductor for enclosing a loop formed by the washer coil is formed by a thin film of a superconductor material.

11. A superconducting quantum interference device comprising: a superconducting loop containing one or more Josephson junctions formed of a superconductive material; a washer coil coupled to the Josephson junctions to form a superconducting loop; a detection coil couple to the washer coil for detecting a magnetic field; a signal source for supplying a control signal to the detection coil for detecting an external magnetic field; and a superconductive film surrounding the washer coil to decrease linking between the control signal and the washer coil.

12. A superconducting quantum interference device according to claim 11; further comprising a feedback-modulation coil coupled to the washer coil.

13. A superconducting quantum interference device according to claim 12; wherein the control signal is supplied to the detection coil through the feedback-modulation coil.

14. A superconducting quantum interference device according to claim 12; wherein the superconductive film is formed above or below the washer coil.

15. A superconducting quantum interference device according to claim 12; further comprising an interlayer insulation film disposed between the washer coil and the superconductive film.

16. A superconducting quantum interference device according to claim 11; wherein the superconductive film comprises a ground plane layer formed above or below the washer coil with an interlayer insulation layer sandwiched therebetween so that an external magnetic field does not extend through the ground plane.

17. A superconducting quantum interference device according to claim 11; wherein the superconductive film is formed of a material having a critical magnetic field greater than a critical magnetic field of superconducting thin films forming the Josephson junctions and the washer coil.

18. A superconducting quantum interference device according to claim 11; further comprising an input coil; and wherein the washer coil is coupled to the Josephson junctions to form a first superconducting loop, the input coil is coupled to washer coil to form a second superconducting loop together with the detection coil for delivering an external magnetic field detected by the detection coil to the first superconducting loop.

19. A superconducting quantum interference device according to claim 11; further comprising a substrate on which the Josephson junctions, the washer coil and the detection coil are formed.

20. A superconducting quantum interference device according to claim 11; wherein the Josephson junctions, the washer coil and the detecting coil are each formed of a thin film superconductive layer.

21. A superconducting quantum interference device according to claim 11 wherein the detection coil and the washer coil are coupled by a strip line connector.

22. A superconducting quantum interference device which generates a voltage signal periodically varied by a magnetic flux comprising: one or more Josephson junctions; a washer coil coupled to the one or more Josephson junctions to form a first superconducting loop; a detection coil coupled to the washer coil; a feedback-modulation coil magnetically coupled to the washer coil; an input coil magnetically coupled to the washer coil and forming a second superconducting loop together with the detection coil for delivering an external magnetic field detected by the detection coil to the first superconducting loop; an external control system for supplying a signal to the detection coil to detect an external magnetic field, the control signal being supplied to the first superconducting loop through the feedback-modulation coil; and a ground plane layer formed of a superconductor for enclosing a loop formed by the washer coil, the superconductor being formed on one of an upper layer and a lower layer of the washer coil so as to be separated from the washer coil by a thin insulating film.

23. A superconducting quantum interference device according to claim 22; wherein the superconductor for enclosing a loop formed by the washer coil is formed of a material having a critical magnetic field greater than a critical magnetic field of superconducting thin films forming the Josephson junction and the washer coil.

24. A superconducting quantum interference device according to claim 22; wherein the superconductor for enclosing a loop formed by the washer coil is formed by a thin film of a superconductor material.

25. A superconducting quantum interference device according to claim 22; wherein the superconductor for enclosing a loop formed by the washer coil is formed of a material having a critical magnetic field greater than a critical magnetic field of superconducting thin films forming the Josephson junction and the washer coil.

26. A superconducting quantum interference device according to claim 22; wherein the superconductor for enclosing a loop formed by the washer coil is formed by a thin film of a superconductor material.

* * * * *